United States Patent
Nishiura

(10) Patent No.: US 7,663,861 B2
(45) Date of Patent: Feb. 16, 2010

(54) SEMICONDUCTOR DEVICE AND METHOD OF MANUFACTURING THE SEMICONDUCTOR DEVICE

(75) Inventor: Shinji Nishiura, Kyoto (JP)

(73) Assignee: Panasonic Corporation, Osaka (JP)

( * ) Notice: Subject to any disclaimer, the term of this patent is extended or adjusted under 35 U.S.C. 154(b) by 29 days.

(21) Appl. No.: 12/331,707

(22) Filed: Dec. 10, 2008

(65) Prior Publication Data
US 2009/0147438 A1    Jun. 11, 2009

(30) Foreign Application Priority Data
Dec. 10, 2007    (JP) .............................. 2007-317917

(51) Int. Cl.
*H01G 4/228*    (2006.01)

(52) U.S. Cl. .............. 361/306.2; 361/306.1; 361/306.3; 361/301.4; 361/308.3; 361/313; 257/195; 257/196; 257/500; 257/502

(58) Field of Classification Search .............. 361/306.2, 361/306.1, 306.3, 301.4, 308.1, 311–313, 361/303–305; 257/500, 502, 195, 196
See application file for complete search history.

(56) References Cited

U.S. PATENT DOCUMENTS

| 5,585,655 | A | * | 12/1996 | Ota et al. ..................... 257/282 |
|---|---|---|---|---|
| 5,923,072 | A | * | 7/1999 | Wada et al. .................. 257/473 |
| 6,433,441 | B1 | * | 8/2002 | Niwa et al. ................... 257/784 |
| 6,784,533 | B2 | * | 8/2004 | Shimizu et al. ............. 257/691 |
| 7,202,567 | B2 | | 4/2007 | Kikuta et al. |
| 7,268,303 | B2 | * | 9/2007 | Ashida ........................ 174/260 |
| 7,348,623 | B2 | | 3/2008 | Akiyama |
| 7,417,296 | B2 | * | 8/2008 | Akiyama ..................... 257/500 |
| 2002/0153554 | A1 | | 10/2002 | Kajita et al. |
| 2004/0099897 | A1 | | 5/2004 | Tsutsue et al. |

FOREIGN PATENT DOCUMENTS

JP    2006-310894    11/2006

* cited by examiner

*Primary Examiner*—Nguyen T Ha
(74) *Attorney, Agent, or Firm*—McDermott Will & Emery LLP

(57) ABSTRACT

An MIM capacitance element (capacitance lower electrode, capacitance insulation film and capacitance upper electrode) is provided on a first insulation film on a semiconductor substrate. An interlayer insulation film is provided so as to cover the MIM capacitance element and flattened. The interlayer insulation film is provided with a first connection plug connected to the capacitance upper electrode, a first wiring layer, and a second wiring layer. A second insulation film is provided on the interlayer insulation film. The second insulation film is provided with first and second openings. A wiring pull-out portion which connects the first connection plug and the second wiring layer to each other is provided on the second insulation film.

13 Claims, 6 Drawing Sheets

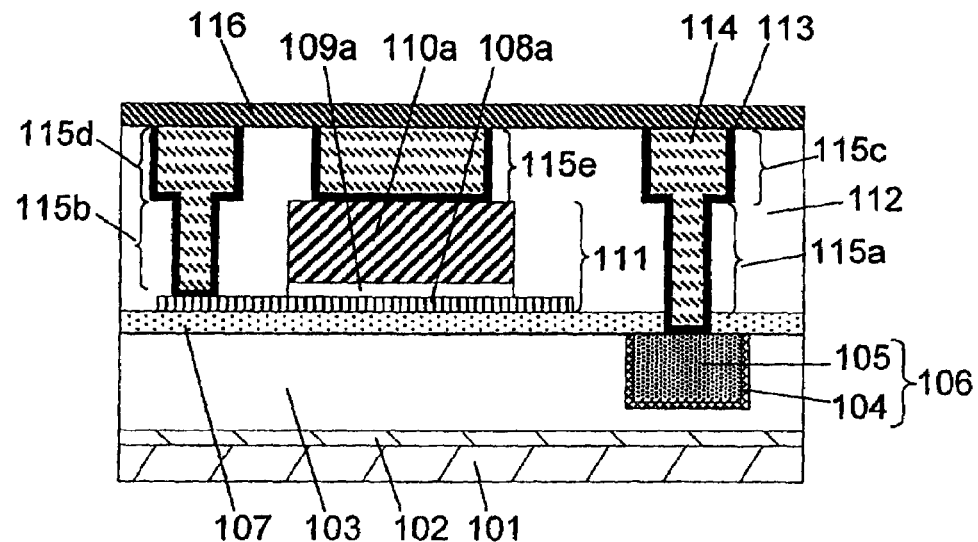
FIG. 5 – *PRIOR ART* –
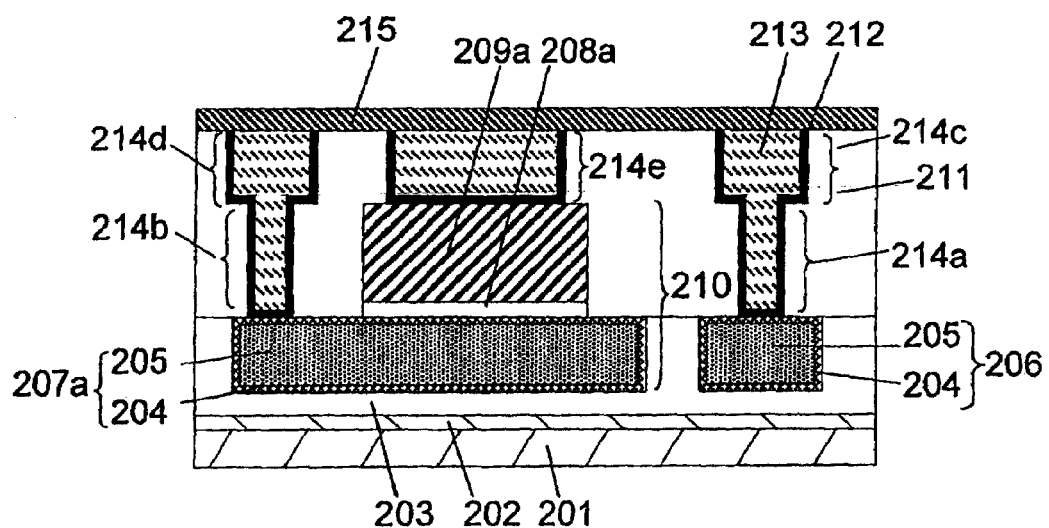
FIG. 6 – *PRIOR ART* –

FIG. 7A —*PRIOR ART*—
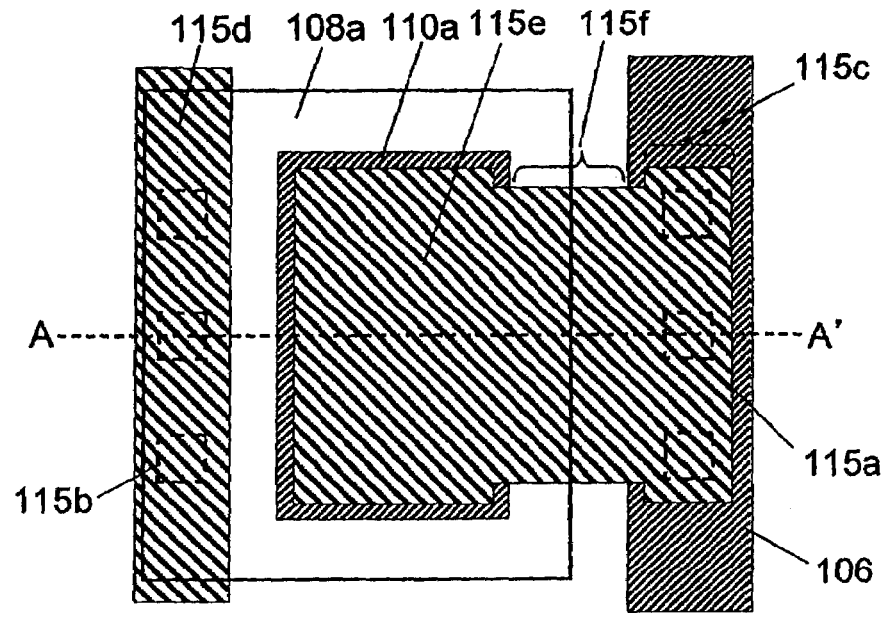
FIG. 7B —*PRIOR ART*—
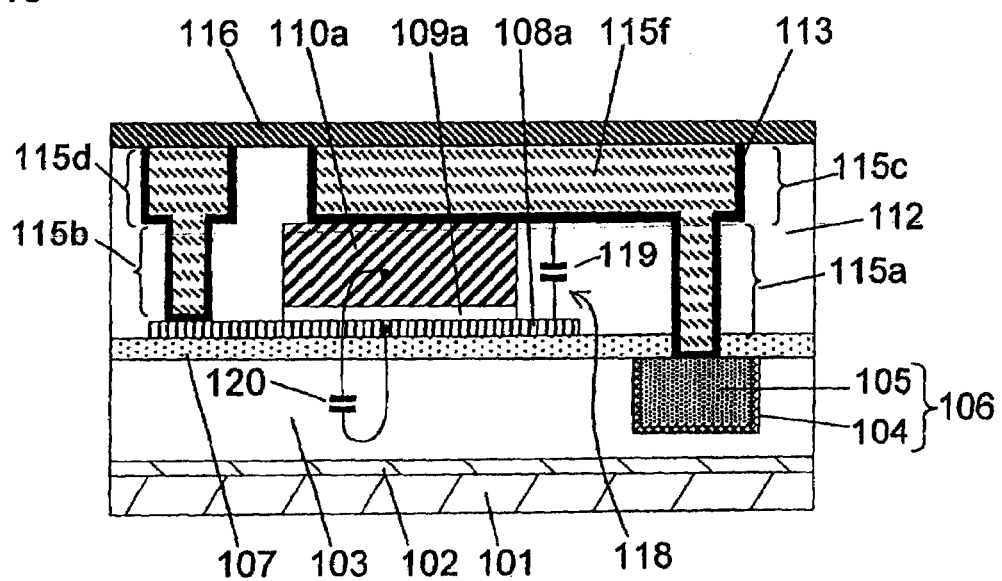

SEMICONDUCTOR DEVICE AND METHOD OF MANUFACTURING THE SEMICONDUCTOR DEVICE

BACKGROUND OF THE INVENTION

1. Field of the Invention

The present invention relates to a semiconductor device and a method of manufacturing the semiconductor device, more particularly to a semiconductor device comprising an MIM (Metal-Insulator-Metal) capacitance element and a method of manufacturing the semiconductor device.

2. Description of the Related Art

In recent years, as a capacitance element is often adopted an MIM capacitance element having a parasitic resistance and a parasitic capacitance significantly smaller than those of a conventional MOS capacitance element. In a high-frequency analog integrated circuit used in the field of mobile communication or the like, in particular, it is demanded that a more effective MIM capacitance element in which the parasitic resistance and the parasitic capacitance are further reduced be developed in order to improve an operation speed and reduce power consumption. In view of the reduction of the parasitic resistance and the parasitic capacitance in wiring, Cu multi-layered wiring (Cu interconnect), which is generally used in a system LSI, is adopted increasingly often in the high-frequency analog integrated circuit.

FIGS. 5 and 6 are sectional views illustrating structures of conventional MIM capacitance elements formed in the Cu multilayered wiring, which are recited in 2006-310894 of the Unexamined Japanese Patent Applications Laid-Open. In the MIM capacitance element illustrated in FIG. 5, an insulation film 102, which is an insulating isolation film, is formed on a semiconductor substrate 101, and a first interlayer insulation film 103 is formed on the insulation film 102. In the first interlayer insulation film 103, a first wiring layer 106 (comprising a first Cu layer 105 and a first barrier metal film 104) is formed. A first barrier insulation film 107 (made of SiN film) is formed on the first interlayer insulation film 103 and the first wring layer 106 for the purpose of the diffusion of Cu and the prevention of oxidation. An MIM capacitance element 111 is formed on the barrier insulation film 107. The MIM capacitance element 111 comprises a capacitance lower electrode 108a which is made of a first TiN film 108, a capacitance insulation film 109a which is made of a second SiN film 109, and a capacitance upper electrode 110a which is made of a second TiN film 110. A second interlayer insulation film 112 is formed on the barrier insulation film 107 and the MIM capacitance element 111. In the second interlayer insulation film 112 are formed a wiring plug 115a (connected to the first wiring layer 106), a second wiring layer 115c (the wiring plug 115a and the second wiring layer 115c both comprise a second Cu layer 114 and a second barrier metal film 113), a capacitance lower electrode plug 115b (connected to the capacitance lower electrode 108a), capacitance lower electrode wiring 115d (the capacitance lower electrode plug 115b and the capacitance lower electrode wiring 115d both comprise the second Cu layer 114 and the second barrier metal film 113), and a capacitance upper electrode connecting section 115e (comprising the second Cu layer 114 and the second barrier metal film 113, and connected to the capacitance upper electrode 110a). A second barrier insulation film 116 (SiN film) is formed on the second interlayer insulation film 112, second wiring layer 115c, capacitance lower electrode wiring 115d, and capacitance upper electrode wiring 115e.

FIG. 6 is a sectional view illustrating a constitution of an MIM capacitance element having a structure different to that of the MIM capacitance element illustrated in FIG. 5. In the MIM capacitance element, a Cu layer and a barrier metal layer constitute a capacitance lower electrode. In FIG. 6, an insulation film 202, which is an insulating isolation layer, is formed on a semiconductor substrate 201, and a first interlayer insulation film 203 is formed on the insulation film 202. In the first interlayer insulation film 203, a first wiring layer 206 and a capacitance lower electrode 207a are formed. A first Cu layer 205 and a first barrier metal film 204 constitute the first wiring layer 206 and the capacitance lower electrode 207a. A capacitance insulation film 208a which is made of a first SiN film 208, and a capacitance upper electrode 209a which is made of a first TiN film 209 are formed on the capacitance lower electrode 207a to constitute an MIM capacitance element 210. A second interlayer insulation film 211 is formed on the first wiring layer 206, MIM capacitance element 210, and interlayer insulation film 203. In the second interlayer insulation film 211, a wiring plug 214a (connected to the first wiring layer 206), a second wiring layer 214c, a capacitance lower electrode plug 214b (connected to the capacitance lower electrode 207a), a capacitance lower electrode wiring 214d, and a capacitance upper electrode connecting section 214e are formed. A second Cu layer 213 and a second barrier metal film 212 constitute the wiring plug 214a, second wiring layer 214c, and capacitance lower electrode plug 214b. The second Cu layer 213 and the second barrier metal film 212 constitute the capacitance upper electrode connecting section 214e. The capacitance upper electrode connecting section 214e is connected to a capacitance upper electrode 209a. A second barrier insulation film 215 (SiN film) is formed on the second interlayer insulation film 211, second wiring layer 214c, capacitance lower electrode wiring 214d, and capacitance upper electrode connecting section 214e.

However, in the MIM capacitance element illustrated in FIG. 5, it is necessary to reduce the thickness of the capacitance lower electrode film 108a (first TiN film 108) to approximately 40 nm in order to form a wiring connection hole and a capacitance lower electrode connection hole at the same time, and a sheet resistance of the capacitance lower electrode 108a is thereby approximately 50Ω/□. In the MIM capacitance element conventionally used in a high-frequency analog integrated circuit having the aluminum multilayered wiring structure, an AlCu film having the thickness of approximately 500 nm generally constitutes the capacitance lower electrode, wherein the sheet resistance of the capacitance lower electrode was approximately 70 mΩ/□. Therefore, in the MIM capacitance element illustrated in FIG. 5, the parasitic resistance is significantly larger than the parasitic resistance generated in the MIM capacitance element conventionally used in the high-frequency analog integrated circuit. As a result, it becomes impossible to obtain targeted high-frequency characteristics.

Further, as illustrated in a planar structure of an MIM capacitance element in FIG. 7A, a pull-out portion 115f is conventionally provided in the capacitance upper electrode connecting section 115e of the MIM capacitance element illustrated in FIG. 5, though it is not recited in the foregoing document. The capacitance upper electrode connecting section 115e is pulled out of the region of the capacitance lower electrode 108a via the pull-out portion 115f, and connected to another wiring layer in the integrated circuit. FIG. 7B is a sectional view of the MIM capacitance element including the pull-out portion 115f of the capacitance upper electrode connecting section 115e (sectional view cut along A-B line in FIG. 7A).

As illustrated in FIG. 7B, the capacitance upper electrode connecting section 115e, pull-out portion 115f, and capacitance lower electrode 108a are formed in the second interlayer insulation film 112, and an interval therebetween is limited by the thickness of the two layers which are the capacitance upper electrode 110a and the capacitance insulation film 109a (approximately 350 nm in the above-mentioned conventional example). In the MIM capacitance element conventionally used in the high-frequency analog integrated circuit having the aluminum multilayered wiring structure, the interval between the capacitance upper electrode wiring and the capacitance lower electrode is generally approximately 800 nm. As a result, a capacitance value 119 of a region 118 where the pull-out portion 115f of the capacitance upper electrode wiring and the capacitance lower electrode 108a overlap with each other is increased. The capacitance value 119 affects a capacitance value 120 of the MIM capacitance element as the parasitic capacitance.

On the other hand, in the MIM capacitance element illustrated in FIG. 6, because the Cu wiring layer having the thickness of approximately 300 nm is used to form the capacitance lower electrode 207a, the sheet resistance of the capacitance lower electrode 207a can be reduced to approximately 80 mΩ/□. However, the formation of dents, which is generally called dishing, occurs on the surface of the Cu layer because the Cu wiring layer of the capacitance lower electrode 207a is formed in such a way that Cu is embedded in a wiring groove and thereafter flattened by means of the CMP. The dishing is particularly eminent in the case where such a Cu layer having a large surface area as the electrodes in the MIM capacitance element is formed. Therefore, the sheet resistance of the capacitance lower electrode 207a largely varies, which makes the parasitic resistance vary more greatly. Further, the thickness of the second interlayer insulation film 211 is increased in a region where the surface of the Cu layer is significantly concave when the area of the capacitance lower electrode is large. The total thickness of the capacitance upper electrode connecting section 214e, capacitance upper electrode 209a and capacitance insulation film 208a is adjusted to be equal to the thickness of the second interlayer insulation film 211. Therefore, in the MIM capacitance element in which the area of the capacitance lower electrode is large, the depth of the wiring groove set for the second Cu layer 213 is inadequate for the groove to reach the surface of the capacitance upper electrode 209a, and consequently the electrical connection between the capacitance upper electrode connecting section 214e and the capacitance upper electrode 209a may fail. As a result, it becomes impossible to reliably form the MIM capacitance element.

SUMMARY OF THE INVENTION

Therefore, a main object of the present invention is to provide a high-performance MIM capacitance element having a small parasitic resistance and a small parasitic capacitance and superior in its high-frequency characteristics.

In order to achieve the object, a semiconductor device according to the present invention comprises:

a semiconductor substrate;

a first insulation film provided on the semiconductor substrate;

a capacitance lower electrode provided on the first insulation film;

a capacitance insulation film provided on the capacitance lower electrode;

a capacitance upper electrode provided on the capacitance insulation film;

an interlayer insulation film with its flattened upper surface provided on the first insulation film so as to cover the capacitance lower electrode, the capacitance insulation film and the capacitance upper electrode;

a first connection plug embedded in the interlayer insulation film and connected to the capacitance upper electrode;

a first wiring layer embedded in the interlayer insulation film and connected to the capacitance lower electrode;

a second wiring layer embedded in the interlayer insulation film;

a second insulation film provided on the interlayer insulation film;

a first opening penetrating through the second insulation film and reaching the first connection plug;

a second opening penetrating through the second insulation film and reaching the second wiring layer; and a wiring pull-out portion provided on the second insulation film so as to fill the first and second openings and connect the first connection plug and the second wiring layer to each other, wherein the capacitance lower electrode, the capacitance insulation film and the capacitance upper electrode constitute an MIM capacitance element, and the capacitance upper electrode is electrically connected to the second wiring layer via the first connection plug and the wiring pull-out portion.

A method of manufacturing a semiconductor device according to the present invention includes a first step of depositing a first metal film, a dielectric film and a second metal film in this order on a first insulation film formed on a semiconductor substrate;

a second step of forming an MIM capacitance element comprising a capacitance upper electrode, a capacitance insulation film and a capacitance lower electrode by selectively etching the second metal film, the dielectric film and the first metal film;

a third step of depositing an interlayer insulation film on the first insulation film so as to cover the MIM capacitance element and thereafter polishing and flattening a surface of the interlayer insulation film;

a fourth step of forming a lower wiring connection hole, a capacitance lower electrode connection hole reaching the capacitance lower electrode in the interlayer insulation film;

a fifth step of forming a capacitance upper electrode connection hole reaching the capacitance upper electrode in the interlayer insulation film;

a sixth step of forming a first connection plug embedded in the capacitance upper electrode connection hole and connected to the capacitance upper electrode, a first wiring layer embedded in the capacitance lower electrode connection hole and connected to the capacitance lower electrode, and a second wiring layer embedded in the lower wiring connection hole by depositing a third metal film on the interlayer insulation film and then polishing the third metal film;

a seventh step of forming a second insulation film on the interlayer insulation film;

an eighth step of forming a first opening reaching the first connection plug and a second opening reaching the second wiring layer in the second insulation film; and an ninth step of forming a wiring pull-out portion for connecting the capacitance upper electrode and the second wiring layer to each other via the first connection plug by depositing a fourth metal film on the second insulation film so that the fourth metal film is embedded in the first opening and connected to the first metal plug and embedded in the second opening and connected to the second wiring layer and thereafter selectively etching the fourth metal film.

According to the semiconductor device and the semiconductor device manufacturing method provided by the present invention, the film thickness of the capacitance upper electrode can be reduced, while the film thickness of the capacitance lower electrode can be increased to the maximum. As a result, the sheet resistance of the capacitance lower electrode can be largely reduced.

Further, the wiring pull-out portion which connects the capacitance upper electrode and the second wiring layer to each other is formed on the second insulation film. Accordingly, the interlayer thickness between the capacitance upper electrode pull-out portion and the capacitance lower electrode can be increased even though the capacitance lower electrode is thickened. As a result, the parasitic capacitance can be largely reduced.

Further, there is no dishing problem seen conventionally because a deposited metal film is etched to form the capacitance lower electrode.

As so far described, according to the present invention, a high-performance MIM capacitance element in which the parasitic resistance and the parasitic capacitance are small can be reliably formed in Cu multilayered wiring.

The present invention, by which a high-performance MIM capacitance element in which the parasitic resistance and the parasitic capacitance are small can be formed in Cu multilayered wiring, is useful for increasing the performance of a high-frequency analog integrated circuit.

BRIEF DESCRIPTION OF THE DRAWINGS

These and other objects of the invention will become clear by the following description of preferred embodiments of the invention and be specified in the claims attached hereto. A number of benefits not recited in this specification will come to the attention of the skilled in the art upon the implementation of the present invention.

FIG. 5 is a sectional view for describing problems in a conventional semiconductor device.

FIG. 6 is a sectional view for describing problems in a conventional semiconductor device.

FIG. 7A is a planar view for describing problems in a conventional semiconductor device.

FIG. 7B is a sectional view for describing problems in the conventional semiconductor device.

DETAILED DESCRIPTION OF THE INVENTION

Figure 1A:
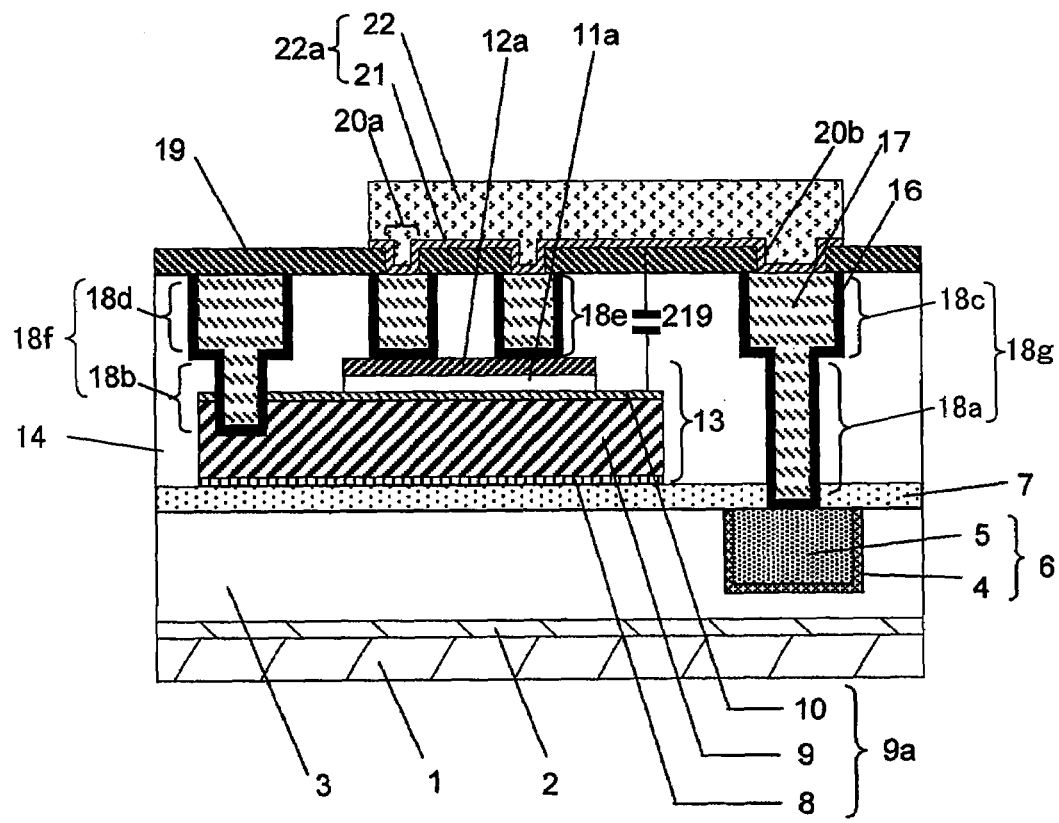
FIG. 1A is a sectional view illustrating a semiconductor device according to a preferred embodiment 1 of the present invention.

Hereinafter, preferred embodiments of the present invention are described referring to the drawings.

Preferred Embodiment 1

Figure 1B:
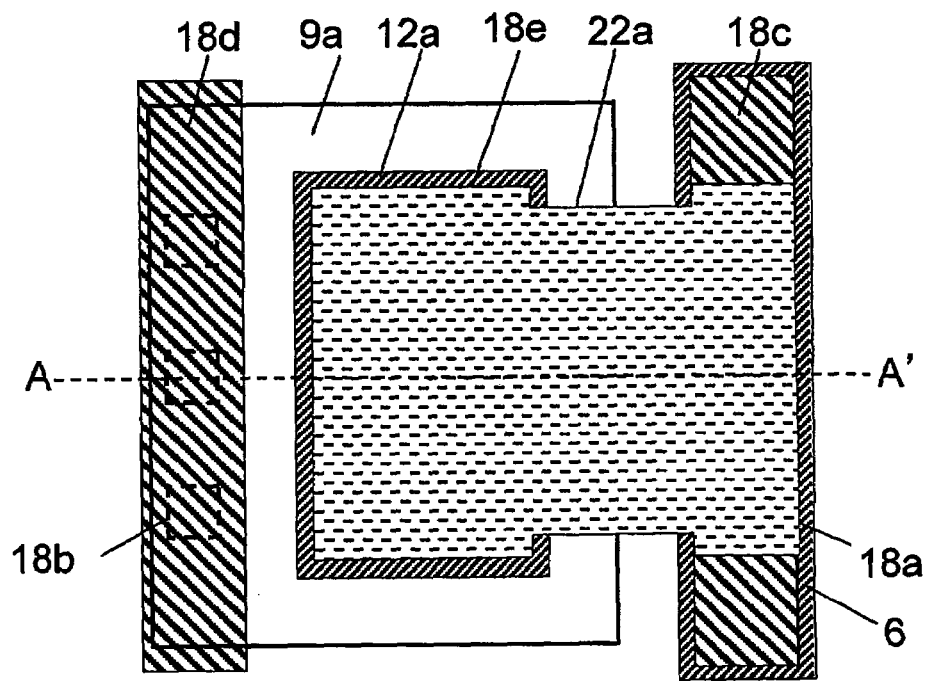
FIG. 1B is a planar view illustrating the semiconductor device according to the preferred embodiment 1.

FIGS. 1A and 1B are respectively a sectional view and a planar view illustrating a semiconductor device according to a preferred embodiment 1 of the present invention, wherein an MIM capacitance element and wiring layers (upper wiring layer and lower wiring layer) are illustrated. As illustrated in FIG. 1A, an insulating isolation layer 2 is formed on a semiconductor substrate 1, and a first insulation film 3 is further formed on the insulating isolation layer 2. A lower wiring layer 6 is embedded in an upper section (surface portion) of the first insulation film 3. A Cu layer 5 and a first barrier metal film 4 (TaN film) constitute the lower wiring layer 6. A barrier insulation film 7 is formed on the first insulation film 3 and the lower wiring layer 6. The barrier insulation film 7, which is made of a SiN film (thickness is approximately 200 nm), is provided for the diffusion of Cu and the prevention of oxidation. An MIM capacitance element 13 is formed on the barrier insulation film 7. The MIM capacitance element 13 comprises a capacitance lower electrode 9a, a capacitance insulation film 11a and a capacitance upper electrode 12a. The capacitance lower electrode 9a is a multilayered film comprising a second barrier metal film 8, an AlCu film 9 (thickness is approximately 400 nm), and a TiN film (thickness is approximately 50 nm). The second barrier metal film 8 is a multilayered film comprising a TiN film (thickness is approximately 20 nm) and a Ti film (thickness is approximately 20 nm). A SiN film (thickness is approximately 30 nm) constitutes the capacitance insulation film 11a. A TiN film (thickness is approximately 100 nm) constitutes the capacitance upper electrode 12a.

An interlayer insulation film 14, which is made of a flattened $SiO_2$ film, is formed on the barrier insulation film 7 and the MIM capacitance element 13. The thickness of the interlayer insulation film 14 is approximately 1,000 nm on the barrier insulation film 7, approximately 510 nm on the capacitance lower electrode 9a, and approximately 380 nm on the capacitance upper electrode 12a. In the interlayer insulation film 14, a third connection plug 18a, a second upper wiring layer 18c, a second connection plug 18b, a first upper wiring layer 18d and a first connection plug 18e are formed. The third connection plug 18a and the second upper wiring layer 18c constitute a second wiring layer 18g, and the second connection plug 18b and the first upper wiring layer 18d constitute a first wiring layer 18f. A third barrier metal film (TaN film) 16 and a Cu wiring layer 17 constitute the third connection plug 18a, second upper wiring layer 18c, second connection plug 18b, first upper wiring layer 18d and first connection plug 18e. The third connection plug 18a is connected to the lower wiring layer 6. The second connection plug 18b is connected to the capacitance lower electrode 9a. The first connection plug 18e is connected to the capacitance upper electrode 12a.

An upper surface of the third connection plug 18a, an upper surface of the second connection plug 18b and an upper surface of the capacitance upper electrode 12a are positioned at the same height. The second upper wiring layer 18c, first upper wiring layer 18d and first connection plug 18e have the same thickness, which is approximately 380 nm in the present preferred embodiment.

A second insulation film 19 is formed on the interlayer insulation film 14, second upper wiring layer 18c, first upper wiring layer 18d and first connection plug 18e. A SiN film (thickness is approximately 20 nm) constitutes the second insulation film 19. A first opening 20a reaching the first connection plug 18e is formed in second insulation film 19 on the first connection plug 18e. A second opening 20b reaching the second upper wiring layer 18c is formed in the second insulation film 19 on the second upper wiring layer 18c. A wiring pull-out portion 22a is formed on the second insulation film 19 where the first opening 20a and the second opening 20b are provided. The wiring pull-out portion 22a is partly embedded in the first opening 20a and the second opening 20b and connected to the first connection plug 18e and the second upper wiring layer 18c. A fourth barrier metal film 21 and an AlCu film (thickness is approximately 800 nm) 22 constitute the wiring pull-out portion 22a. A TiN film (thickness is approximately 100 nm) and a Ti film (thickness is approximately 30 nm) constitute the fourth barrier metal film 21. The first upper wiring layer 18d and the second upper wiring layer 18c constitute the upper wiring layer.

As illustrated in FIG. 1B, the capacitance upper electrode 12a is connected to the wiring pull-out portion 22a by means of the first connection plug 18e, and the capacitance upper electrode 12a is thereby connected to the second upper wiring layer 18c via the first connection plug 18e and the wiring pull-out portion 22a. In other words, the first connection plug 18e and the second upper wiring layer 18c which is one of the upper wiring layers are not directly connected to each other but are connected to each other via the wiring pull-out portion 22a, which is made of an AlCu film 22 used for a pad electrode, as described later. Therefore, the second insulation film 19 (SiN film: thickness is approximately 200 nm) and the interlayer insulation film 14 (SiO$_2$ film: thickness is approximately 510 nm) constitute an interlayer film between the wiring pull-out portion 22a and the capacitance lower electrode 9a, increasing the total film thickness. Therefore, a capacitance value 219 per interlayer area unit is approximately 0.05 fF/μm2, which is approximately the half of the capacitance value 119 in the conventional example illustrated in FIG. 5.

An element characteristic failure is caused when the first connection plug 18e reaches the capacitance insulation film 11a. Therefore, in the semiconductor device according to the present preferred embodiment, the capacitance upper electrode 12a is thinned up to the minimum thickness required to prevent the first connection plug 18e from reaching the capacitance insulation film 11a. Accordingly, the film thickness of the capacitance lower electrode 9a is increased to the fullest, and a sheet resistance thereof is approximately 70 mΩ/□. Thus, the sheet resistance can be significantly smaller than that in the conventional example illustrated in FIG. 5, and sufficient high-frequency characteristics can be obtained. In the structure of the semiconductor device according to the present preferred embodiment, because a Cu wiring layer is not used in the capacitance lower electrode 9a, there is no dishing problem.

As described so far, the parasitic resistance and the parasitic capacitance can be significantly reduced in the MIM capacitance element formed in the Cu multilayered wiring according to the present preferred embodiment in comparison to the conventional technology.

Preferred Embodiment 2

FIGS. 2A-2D, FIGS. 3A-3C and FIGS. 4A and 4B are sectional views illustrating steps in semiconductor device manufacturing methods according to a preferred embodiment 2 of the present invention. These drawings particularly illustrate the method of manufacturing the semiconductor device including the MIM capacitance element as illustrated in FIGS. 1 and 2.

Figure 2A:
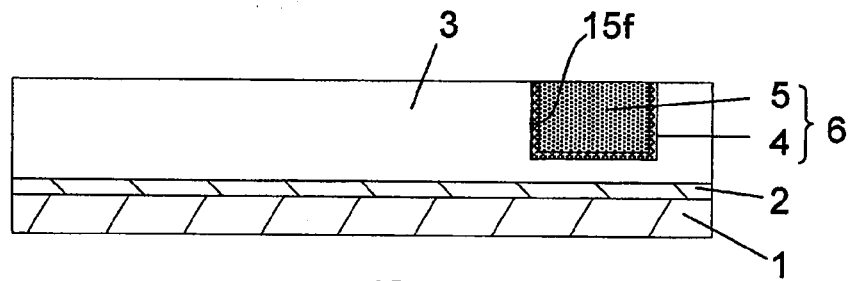
FIGS. 2A-2D are sectional views illustrating steps in an early stage of a semiconductor device manufacturing method according to a preferred embodiment 2 of the present invention.

As illustrated in FIG. 2A, first, a first insulation film 3 is formed on an insulating isolation layer 2 formed on a semiconductor substrate 1. Then, a lower wiring groove 15f is formed in the first insulation film 3, and thereafter, a TaN film is deposited in the thickness of approximately 20 nm on a surface of the lower wiring groove 15f by means of sputtering, so that a first barrier metal film 4 is formed. The first barrier metal film 4 is provided for the diffusion of Cu and the prevention of oxidation. A Cu film having the thickness of approximately 100 nm is deposited on the first barrier metal film 4 by means of sputtering, and the Cu film is deposited on the entire surface of the first insulation film 3 by means of electrolytic plating. After that, any unnecessary Cu and TaN is removed by means of CMP (chemical mechanical polishing), so that a Cu layer 5 is embedded in the lower wiring groove 15f. As a result, a lower wiring layer 6 (made of the Cu layer 5 and first barrier metal film 4) embedded in the first insulation film 3 is formed.

Figure 2B:
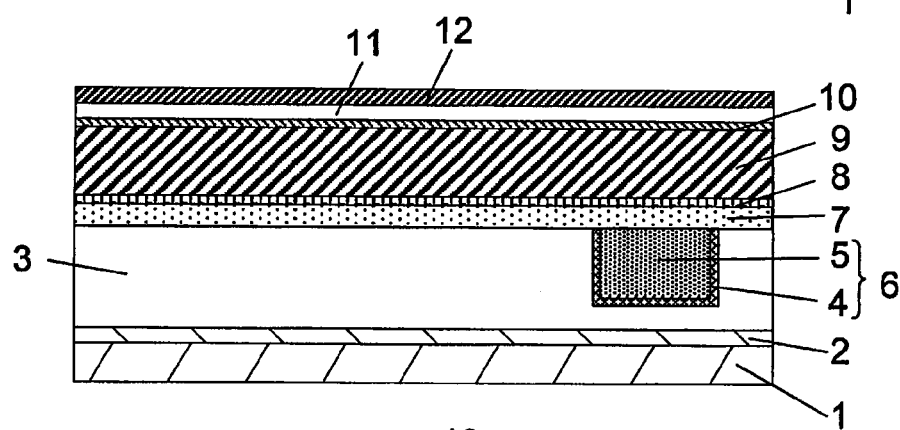

As illustrated in FIG. 2B, a SiN film (thickness is approximately 200 nm) is deposited on surfaces of the first insulation film 3 and the lower wiring layer 6 by means of CVD (chemical vapor deposition). The SiN film serves as a barrier insulation film 7. The barrier insulation film 7 is provided for the diffusion of Cu and the prevention of oxidation. Then, a second barrier metal film 8 is formed in the thickness of 40 nm on the barrier insulation film 7 by means of sputtering. The second barrier metal film 8 is formed as a multilayered film comprising a Ti film having the thickness of approximately 20 nm and a TiN film having the thickness of approximately 20 nm. Then, an AlCu film 9 is deposited in the thickness of approximately 400 nm on the second barrier metal film 8, and a TiN film 10 is deposited in the thickness of approximately 50 nm on the AlCu film 9. Second barrier metal film 8, AlCu film 9 and first TiN film 10 constitute a first metal film.

Further, a dielectric film 11, which is made of a SiN film, is deposited in the thickness of approximately 30 nm on the surface of the TiN film 10 by means of CVD. Then, a second metal film 12, which is made of a TiN film, is deposited in the thickness of approximately 100 nm on the surface of the dielectric film 11 by means of sputtering.

Figure 2C:
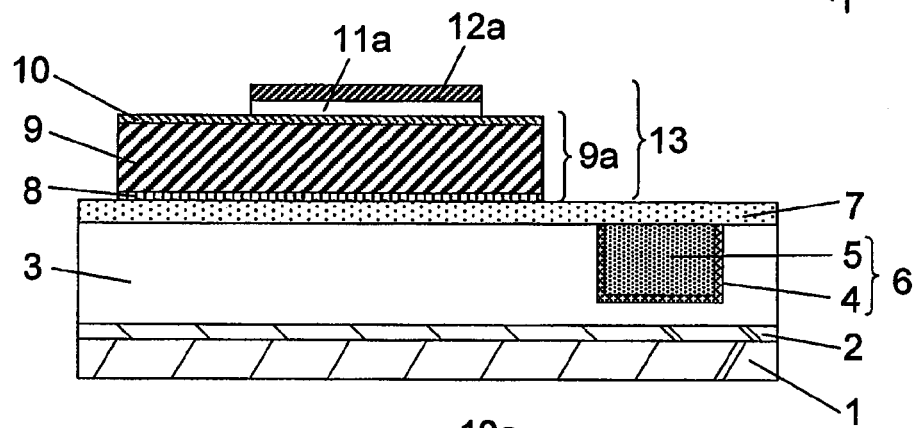

As illustrated in FIG. 2C, the second metal film 12 and the dielectric film 11 are processed by means of photolithography and RIE technology, so that a capacitance upper electrode 12a and a capacitance insulation film 11a are formed. Next, the TiN film 10, AlCu film 9 and second barrier metal film 8 are processed by means of photolithography and RIE technology so that a capacitance lower electrode 9a is formed. Through these steps, an MIM capacitance element 13 comprising the capacitance upper electrode 12a, capacitance insulation film 11a and capacitance lower electrode 9a is formed.

Figure 2D:
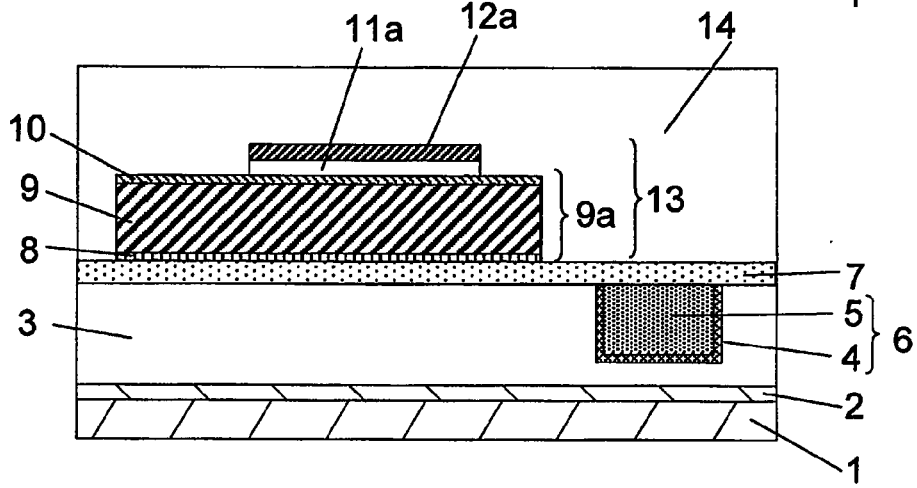

As illustrated in FIG. 2D, a SiO$_2$ film is deposited on the barrier insulation film 7, capacitance upper electrode 12a and capacitance lower electrode 9a by means of CVD and flattened by means of CMP, so that an interlayer insulation film 14 is formed. After the flattening process, the thickness of the interlayer insulation film 14 is approximately 1,000 nm on the barrier insulation film 7, approximately 510 nm on the capacitance lower electrode 9a, and approximately 380 nm on the capacitance upper electrode 12a.

Figure 3A:
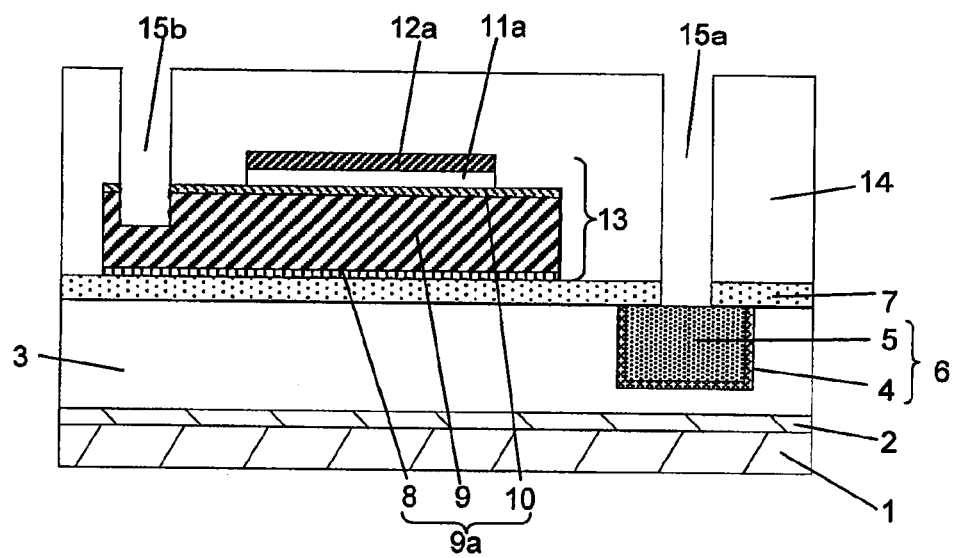
FIGS. 3A-3C are sectional views illustrating steps in an intermediate stage of the semiconductor device manufacturing method according to the preferred embodiment 2.

As illustrated in FIG. 3A, the interlayer insulation film 14 is processed by means of photolithography and RIE technology, so that a wiring connection hole 15a reaching the lower wiring layer 6 and a capacitance lower electrode connection hole 15b reaching the capacitance lower electrode 9a are formed in the interlayer insulation film 14 at the same time. While the interlayer insulation film 14 is being etched by approximately 490 nm (equal to the thickness of the capacitance lower electrode 9a) and the barrier insulation film 7 is being etched by approximately 200 nm, the capacitance lower electrode 9a is overly etched. However, an etching rate of the TiN film or AlCu film is approximately one-fifth or one-tenth of that of the $SiO_2$ film or SiN film, and an etching volume of the capacitance lower electrode 9a in the capacitance lower electrode connection hole 15b is approximately 140 nm-70 nm. In the present preferred embodiment, since the thickness of the capacitance lower electrode 9a is determined to be approximately 490 nm in view of the etching rate and volume, the capacitance lower electrode connection hole 15b is prevented from penetrating through the capacitance lower electrode 9a.

Figure 3B:
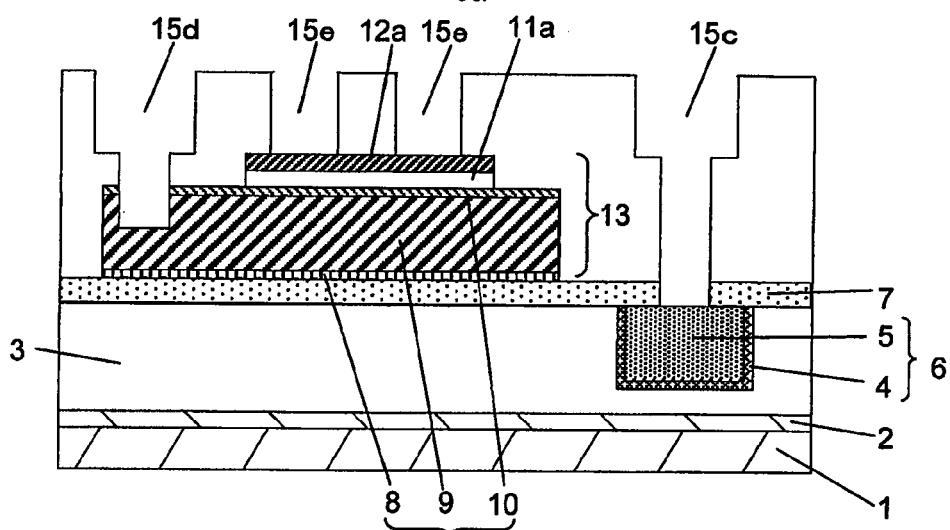

As illustrated in FIG. 3B, a first upper wiring groove 15d, a second upper wiring groove 15c and capacitance upper electrode connection holes 15e are respectively formed in the depth of approximately 380 nm in the interlayer insulation film 14 by means of photolithography and RIE technology. The capacitance upper electrode connection holes 15e are provided on the capacitance upper electrode 12a and have such a depth that reaches the capacitance upper electrode 12a. The first upper wiring groove 15d is provided so as to cover the capacitance lower electrode connection hole 15b. The second upper wiring groove 15c is provided so as to cover the lower wiring connection hole 15a.

A diameter of the capacitance upper electrode connection hole 15e is set to be approximately equal to the width of the second upper wiring groove 15c and the first upper wiring groove 15d, and the number of the capacitance upper electrode connection holes 15e is at least two depending on an area of the capacitance upper electrode 12a. In the case where the diameter of the capacitance upper electrode connection hole 15e is set to be approximately equal to that of the capacitance upper electrode 12a in a manner similar to the conventional example illustrated in FIG. 5, there is a apprehension that the capacitance upper electrode connection hole 15e may penetrate through the capacitance upper electrode 12a due to over-etching since the etching rate thereof is larger than that of the wiring groove. In order to deal with the concern, in the present preferred embodiment, the size of the second upper wiring groove 15c and the first upper wiring groove 15d is set to be approximately equal to that of the capacitance upper electrode connection hole 15e. Accordingly, the respective etching rates are substantially equal, so that the capacitance upper electrode 12a is prevented from being overly etched.

Figure 3C:
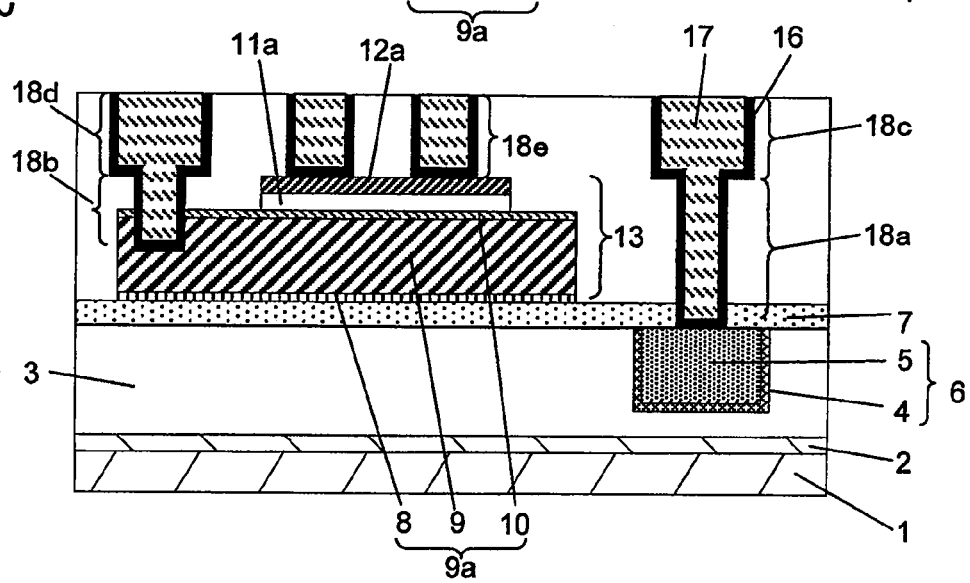

As illustrated in FIG. 3C, a TaN film is deposited in the thickness of approximately 20 nm on the surface of the interlayer insulation film 14 by means of sputtering so as to cover all of the connection holes and wiring grooves, so that a third barrier metal film 16 is formed. Then, a Cu film is deposited in the thickness of approximately 100 nm on the third barrier metal film 16 by means of sputtering, and thereafter, Cu is deposited on the entire surface of the interlayer insulation film 14 (including all of the connection holes and wiring grooves) by means of electrolytic plating. Then, any unnecessary Cu and TaN are removed by means of CMP, so that a Cu wiring layer 17 is embedded in all of the connection holes and wiring grooves. As a result, the following are formed: a first connection plug 18e embedded in the capacitance upper electrode connection hole 15e and connected to the capacitance upper electrode 12a; a second connection plug 18b embedded in the capacitance lower electrode connection hole 15b and connected to the capacitance lower electrode 9a; a first upper wiring layer 18d embedded in the first upper wiring groove 15d and connected to the second connection plug 18b; a third connection plug 18a embedded in the lower wiring connection hole 15a and connected to the lower wiring layer 6; and a second upper wiring layer 18c embedded in the second upper wiring groove 15c and connected to the third connection plug 18a.

As illustrated in FIG. 4, a SiN film (thickness is approximately 200 nm) is deposited on the interlayer insulation film 14, second upper wiring layer 18c, first upper wiring layer 18d and first connection plug 18e by means of CVD. The SiN film serves as a second insulation film 19 provided for the diffusion of Cu and the prevention of oxidation. Further, a first opening 20a reaching the first connection plug 18e and a second opening 20b reaching the second upper wiring layer 18c are formed in the second insulation film 19 by means of photolithography and RIE technology.

Figure 4A:
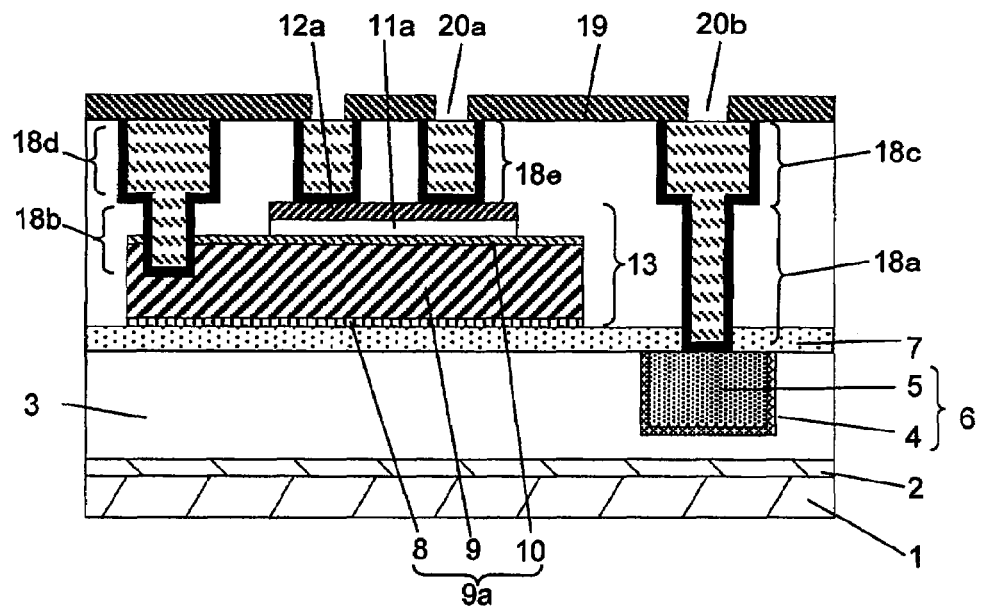
FIGS. 4A and 4B are sectional views illustrating steps in a later stage of the semiconductor device manufacturing method according to the preferred embodiment 2.
Figure 4B:
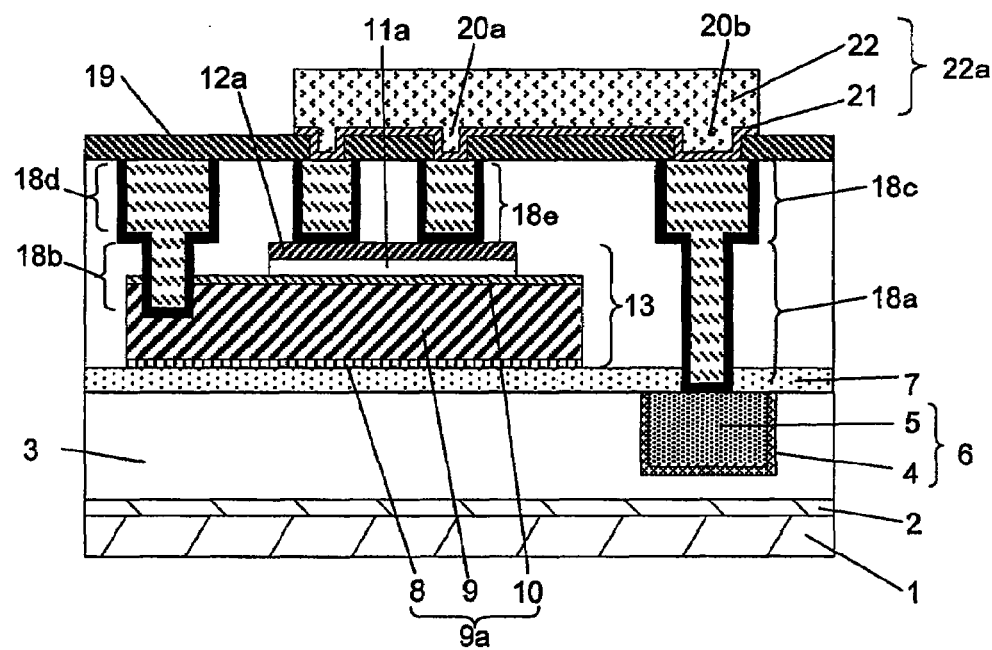

As illustrated in FIG. 4B, a Ti film is deposited in the thickness of approximately 30 nm on the second insulation film 19 provided with the first opening 20a and the second opening 20b by means of sputtering, and a TiN film is then deposited in the thickness of approximately 100 nm on the Ti film. The Ti film and the TiN film constitute a fourth barrier metal film 21. Further, an AlCu film 22 is deposited in the thickness of approximately 800 nm on the fourth barrier metal film 21 by means of sputtering. Then, the AlCu film 22 and the fourth barrier metal film 21 are pattern-processed by means of photolithography and RIE technology, so that a wiring pull-out portion 22a and a pad electrode (not shown) are formed at the same time.

In Cu multilayered wiring including the structure according to the present preferred embodiment, openings are provided in the barrier insulation film (SiN film) formed on the uppermost Cu wiring layer, and an AlCu film (including the AlCu film 22 according to the present preferred embodiment) having a degree of hardness lower than that of the Cu film is formed on the opening, so that a pad electrode is formed. Therefore, a wiring pull-out portion (including the wiring pull-out portion 22a according to the present preferred embodiment) formed together with the pad electrode is formed through the use of the AlCu film used for the pad electrode. Therefore, a manufacturing cost does not increase in comparison to the conventional technology. Further, the barrier insulation film on the uppermost wiring layer also serves as a surface protection film.

As thus far described, according to the present embodiment, the high-performance MIM capacitance element according to the preferred embodiment 1 in which parasitic resistance and parasitic capacitance are small can be reliably formed without any increase of the manufacturing steps in comparison to the conventional technology.

While there has been described what is at present considered to be preferred embodiments of this invention, it will be understood that various modifications may be made therein, and it is intended to cover in the appended claims all such modifications as fall within the true spirit and scope of this invention.

What is claimed is:

1. A semiconductor device comprising:
   a semiconductor substrate;
   a first insulation film provided on the semiconductor substrate;
   a capacitance lower electrode provided on the first insulation film;
   a capacitance insulation film provided on the capacitance lower electrode;
   a capacitance upper electrode provided on the capacitance insulation film;
   an interlayer insulation film with its flattened upper surface provided on the first insulation film so as to cover the capacitance lower electrode, the capacitance insulation film and the capacitance upper electrode;

a first connection plug embedded in the interlayer insulation film and connected to the capacitance upper electrode;
a first wiring layer embedded in the interlayer insulation film and connected to the capacitance lower electrode;
a second wiring layer embedded in the interlayer insulation film;
a second insulation film provided on the interlayer insulation film;
a first opening penetrating through the second insulation film and reaching the first connection plug;
a second opening penetrating through the second insulation film and reaching the second wiring layer; and
a wiring pull-out portion provided on the second insulation film so as to fill the first and second openings and connect the first connection plug and the second wiring layer to each other, wherein
the capacitance lower electrode, the capacitance insulation film and the capacitance upper electrode constitute an MIM capacitance element, and
the capacitance upper electrode is electrically connected to the second wiring layer via the first connection plug and the wiring pull-out portion.

2. The semiconductor device as claimed in claim 1, wherein
a lower wiring layer is embedded in the first insulation film, and
the second wiring layer is connected to the lower wiring layer.

3. The semiconductor device as claimed in claim 1, wherein
a first upper wiring layer and a second connection plug constitute the first wiring layer, and the first upper wiring layer is connected to the capacitance lower electrode via the second connection plug,
a lower wiring layer is embedded in the first insulation film, and
a second upper wiring layer and a third connection plug constitute the second wiring layer, and the second upper wiring layer is connected to the lower wiring layer via the third connection plug.

4. The semiconductor device as claimed in claim 3, wherein
a thickness of the first connection plug, a thickness of the first wiring layer and a thickness of second wiring layer are the same and each of them is set to a value obtained when a thickness of the MIM capacitance element is subtracted from a thickness of the interlayer insulation film.

5. The semiconductor device as claimed in claim 1, wherein
a thickness of the capacitance lower electrode is larger than a thickness of the capacitance upper electrode.

6. The semiconductor device as claimed in claim 1, wherein
a multilayered film comprising a metal alloy film made of AlCu and a metal nitride film made of TiN or TaN constitutes the capacitance lower electrode,
a conductive film made of at least one of AlCu, TiN and TaN constitutes the capacitance upper electrode,
a multilayered film comprising a Cu film and a TaN film constitutes the first connection plug, the second connection plug, the first wiring layer, the third connection plug, and the second wiring layer, and
a multilayered film comprising an AlCu film and a metal nitride film made of TiN or TaN constitutes the wiring pull-out portion.

7. The semiconductor device as claimed in claim 1, wherein
the second wiring layer is an uppermost embedded wiring layer,
the second insulation film is a barrier insulation film also serving as a surface protection film, and
the wiring pull-out portion is a conductive film also serving as a pad electrode.

8. A method of manufacturing a semiconductor device including:
a first step of depositing a first metal film, a dielectric film and a second metal film in this order on a first insulation film formed on a semiconductor substrate;
a second step of forming an MIM capacitance element comprising a capacitance upper electrode, a capacitance insulation film and a capacitance lower electrode by selectively etching the second metal film, the dielectric film and the first metal film;
a third step of depositing an interlayer insulation film on the first insulation film so as to cover the MIM capacitance element and thereafter polishing and flattening a surface of the interlayer insulation film;
a fourth step of forming a lower wiring connection hole, a capacitance lower electrode connection hole reaching the capacitance lower electrode in the interlayer insulation film;
a fifth step of forming a capacitance upper electrode connection hole reaching the capacitance upper electrode in the interlayer insulation film;
a sixth step of forming a first connection plug embedded in the capacitance upper electrode connection hole and connected to the capacitance upper electrode, a first wiring layer embedded in the capacitance lower electrode connection hole and connected to the capacitance lower electrode, and a second wiring layer embedded in the lower wiring connection hole by depositing a third metal film on the interlayer insulation film and then polishing the third metal film;
a seventh step of forming a second insulation film on the interlayer insulation film;
an eighth step of forming a first opening reaching the first connection plug and a second opening reaching the second wiring layer in the second insulation film; and
a ninth step of forming a wiring pull-out portion for connecting the capacitance upper electrode and the second wiring layer to each other via the first connection plug by depositing a fourth metal film on the second insulation film so that the fourth metal film is embedded in the first opening and connected to the first metal plug and embedded in the second opening and connected to the second wiring layer and thereafter selectively etching the fourth metal film.

9. The semiconductor device manufacturing method as claimed in claim 8, further including a step of embedding a lower wiring layer in the first insulation layer as a step prior to the first step, wherein
the lower wiring connection hole reaching the lower wiring layer is formed in the fourth step, and
the third connection plug connected to the lower wiring layer is formed in the sixth step.

10. The semiconductor device manufacturing method as claimed in claim 8,
the fifth step further including a tenth step of forming a first upper wiring groove covering the capacitance lower electrode connection hole and a second upper wiring groove covering the lower wiring connection hole, wherein in the sixth step, the third metal film is deposited on the interlayer insulation film and then polished, so that a second connection plug embedded in the capacitance lower electrode connection hole, a third connection plug embedded in the lower wiring connection hole, a first upper wiring layer embedded in the first upper wiring groove, and a second upper wiring layer embedded in the second upper wiring groove are formed.

11. The semiconductor device manufacturing method as claimed in claim 10, wherein the capacitance upper electrode connection hole, the first upper wiring groove and the second upper wiring groove are formed so as to have the width and the same depth in the fifth step and the tenth step.

12. The semiconductor device manufacturing method as claimed in claim 8, wherein the first metal film is formed to be thicker than the second metal film in the first step.

13. The semiconductor device manufacturing method as claimed in claim 8, wherein a depth of the capacitance upper electrode connection hole, a depth of the first upper wiring groove and a depth of the second upper wiring groove are made to be the same and each of them is set to a value obtained when a thickness of the MIM capacitance element is subtracted from a thickness of the interlayer insulation film in the fifth step and the tenth step.

* * * * *